Sept. 26, 1950 J. H. SCHMIDT 2,523,725

TUNING PLUNGER FOR VARIABLE RESONANT CAVITIES

Filed Nov. 3, 1945

INVENTOR
J. H. SCHMIDT
BY [signature]
ATTORNEY

Patented Sept. 26, 1950

2,523,725

UNITED STATES PATENT OFFICE 2,523,725

TUNING PLUNGER FOR VARIABLE RESONANT CAVITIES

John H. Schmidt, Baltimore, Md., assignor to Western Electric Company, Incorporated, New York, N. Y., a corporation of New York Application November 3, 1945, Serial No. 626,451

2 Claims. (Cl. 173—324)

This invention relates to tuning plungers for variable resonant cavities, wave guides or the like. More particularly, it relates to tuning plungers which effect the proper operation of the resonant cavity by forcibly engaging the walls of the cavity.

Resonant cavities are used in ultra high frequency transmission lines to couple the various stages of a receiver unit in somewhat the same manner that coils, resistors and capacitors do in commercial radio receivers. Basically, they comprise a cylindrical tube or cavity of electrically conductive material in which a tuning plunger is slidably positioned to accomplish the tuning function. The tuning plunger is selectively positioned in the resonant cavity so as to reject the undesired frequencies from the electromagnetic wave energy received therein from high frequency transmitters, wave guides or the like. A resonant cavity is also used as a means of generating an electromagnetic wave energy of a particular frequency, as in an oscillator cavity. In either event, the purpose of the slidably positioned tuning plunger is to vary the conductive length of the cavity and thereby critically affect the amplitude and length of the wave energy being propagated in the resonant cavity.

A tuning plunger used in such resonant cavities must forcibly and uniformly engage the walls thereof, whereby the plunger makes a low resistance electrical contact therewith and accomplishes critical tuning of the resonant cavity. This expedient is especially true in cases where the resonant cavity is processing only a reflected wave signal which has a relatively low amount of electrical energy. Therefore, it is very necessary that the tuning plunger exert a uniform pressure contact against the cavity wall, so as to minimize the contact resistance and corresponding voltage drop thereat.

In order to accomplish these results, the tuning plunger must not have merely a sliding or wiping contact with the resonant cavity wall but must exert considerable uniform pressure against the wall of the cavity. It has been suggested that this result be accomplished by providing a plurality of resilient contacting fingers on the tuning plunger. However, it has been found that it is practically impossible to manufacture a tuning plunger having a plurality of resilient contacting fingers from a solid piece of metal, such as phosphor bronze, because the necessary machining and slotting operations destroy the temper and resiliency of the fingers so formed. Since phosphor bronze cannot be heat treated to increase its temper, any slight overflexing of the fingers leaves them permanently distorted, whereupon they no longer make a uniform pressure contact against the cavity wall.

The present invention overcomes these difficulties by fabricating a tuning plunger which comprises a suitable base of free machining metal, to which is secured a preformed tubular slotted member made of beryllium copper, or the like, having a plurality of closely spaced, elongated, resilient contacting fingers, whose inherent resiliency is retained throughout the various manufacturing operations. This method of fabricating a tuning plunger produces a plunger far superior to that machined from a solid piece of phosphor bronze rod, and, at the same time, the cost of manufacture is about one-fourth that of the machined plunger.

An object of this invention is to provide new and improved tuning plungers for variable resonator cavities.

In accordance with an embodiment of the invention there is provided a composite tuning plunger comprising a tubular base to which is secured a formed tubular member having a plurality of closely spaced, elongated, resilient fingers having arcuate contacting tips formed on the ends thereof. The arcuate contacting tips of the resilient fingers extend beyond the body of the plunger so that, when such a plunger is positioned within a resonant cavity, the resilient fingers are deflected and the arcuate contacting tips conform to the contour of the adjacent wall of the cavity, whereby the resilient fingers exert considerable pressure against the wall of the cavity and make a low resistance electrical contact therewith.

A complete understanding of the invention may be obtained from the following detailed description of a composite tuning plunger forming a specific embodiment thereof, when read in conjunction with the appended drawings, in which Fig. 1 is a fragmentary, longitudinal, sectional view of a resonant cavity showing a composite tuning plunger made in accordance with one embodiment of the invention;

Figure 1:
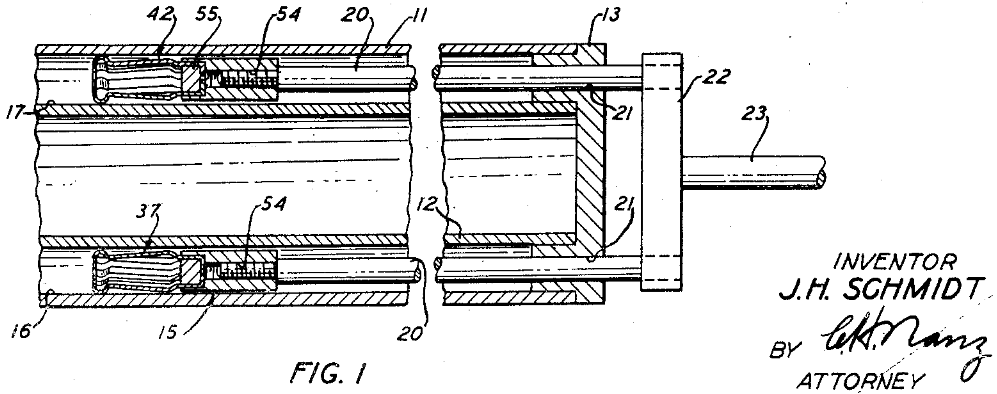

Referring to Fig. 1, there is shown a portion of a resonant cavity which comprises an outer gold plated, tubular conductor 11, an inner gold plated, tubular conductor 12 and an end plate 13. A composite, gold plated tuning plunger 15 is slidably positioned between the conductors 11 and 12, and is adapted to conductively couple the inner surface 16 of the conductor 11 and the outer surface 17 of the conductor 12 of the resonator. The tuning plunger 15 is selectively positioned a given distance from the end plate 13 by means of connecting rods 20—20 secured to the plunger 15 and passing through apertures 21—21 in the end plate 13. The ends of the connecting rods 20—20 are rigidly secured to a tie bar 22, to which is secured a tie rod 23 which may be connected to any suitable adjusting means (not shown). The movement of the tuning plunger 15 within a cavity resonator serves to vary the natural resonance oscillation frequencies present within the resonator and to set up desired conditions of resonance therein. In order to effectively carry out its functions, the tuning plunger 15 must be so constructed that it will make good electrical contact with the resonator cavity conductors 11 and 12 and also effectively confine the electromagnetic wave energy to a given portion of the cavity.

Figure 2:
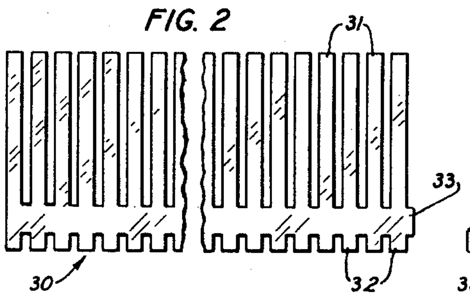
Fig. 2 is a plan view of a slotted strip forming one element of a composite tuning plunger in one stage of its manufacture.

The method of making a composite tuning plunger, such as a plunger 15, comprises slotting a precut blank of resilient conductive material, such as beryllium-copper, as shown in Fig. 2, by means of a punch press or the like. The slotting operation on such a blank produces a double edge comb 30, having a plurality of elongated, resilient fingers 31—31, a plurality of short teeth 32—32, and a solid supporting area 33 therebetween and adjacent to the short-toothed side of the comb 30.

Figure 3:
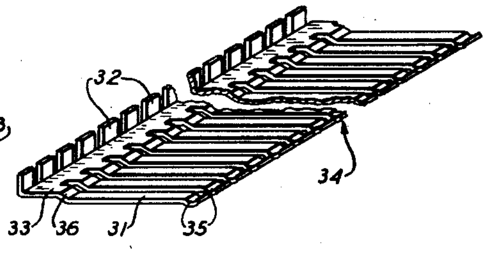
Fig. 3 is a perspective view of the slotted element of Fig. 2 in a more advanced stage of manufacture.

The double edge comb 30 is then formed in a forming press or the like into an irregular shaped element 34 (Fig. 3), wherein the short teeth 32—32 are bent at right angles to the plane of the blank and the resilient fingers 31—31 are crimped at their ends to form thereon a plurality of arcuate contacting tips 35—35. In addition, the fingers are offset at 36 to cause the resilient fingers 31—31 and the contacting tips 35—35 to project from the solid supporting area 33.

Figure 4:
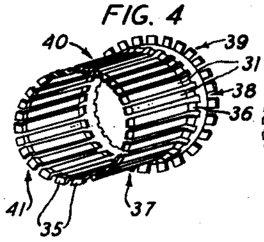
Fig. 4 is a perspective view of an inner ring formed from a slotted element such as is shown in Fig. 3.

The formed element 34 is rolled by conventional means to form a tubular member 37 having a definite predetermined diameter, as shown in Fig. 4. The formed element 34 is rolled into the tubular member 37 in such a manner that the solid area 33 forms an annular base portion 38 and the teeth 32—32 form an external flange 39 around one end thereof. The resilient fingers 31—31 form a tubular body portion 40, which, because of the offset at 36, project inwardly from the inside diameter of the base portion 38. When the element 34 is rolled in this manner, the arcuate contacting tips 35—35 on the ends of the resilient fingers 31—31 project inwardly from the body portion 40 to form thereon an annular series of arcuate contacting tips 41.

Figure 5:
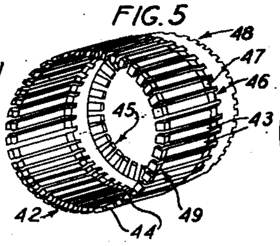
Fig. 5 is a perspective view of an outer ring formed from a slotted element such as is shown in Fig. 3.

A tubular member 42 (Figs. 5) is made in substantially the same manner as the tubular member 37, except that a longer blank of resilient material is slotted and formed to permit a tubular member of greater diameter to be formed therefrom. The longer blank is slotted and formed into an irregular shaped element identical with the formed element 34 (Fig. 3) to form a plurality of elongated, resilient fingers 43—43 crimped at their ends to form a plurality of arcuate contacting tips 44—44 thereon. The longer slotted and formed blank is rolled in the opposite direction to that in which the slotted and formed blank 34 was rolled to produce the tubular member 37. As a result, the tubular member 42 has an inwardly projecting flange 45 and a body portion 46 formed by the resilient contacting fingers 44—44, which, because of an offset 47, project outwardly with respect to a solid, annular base portion 48. When the longer slotted and formed blank is rolled in such direction, the arcuate contacting tips 44—44 on the ends of the individual resilient fingers 43—43 project outwardly from the body portion 48 to form thereon an annular series of arcuate contacting tips 49.

Figure 7:
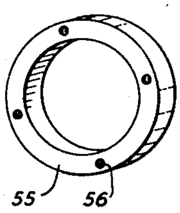
Fig. 7 is a perspective view of a clamping ring.
Figure 6:
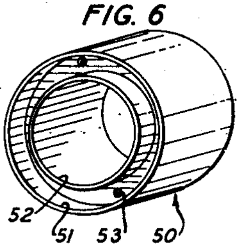
Fig. 6 is a perspective view of a cylindrical base member.
Figure 9:
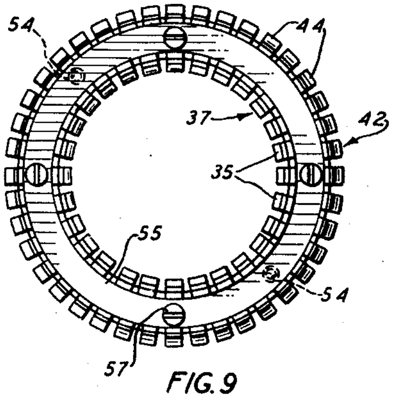
Fig. 9 is an end view of the assembled tuning plunger shown in Fig. 8.
Figure 8:
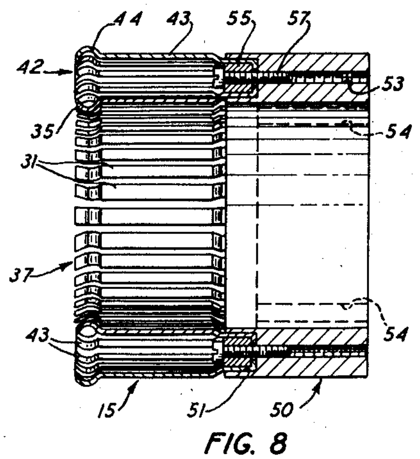
Fig. 8 is a longitudinal, sectional view showing the complete assembly of a tuning plunger embodying the invention.

A tubular base 50 (Fig. 6) has an annular groove 51 cut in one end thereof and a central longitudinal bore 52 extending therethrough. The outside diameter of the base 50 is substantially equal to the outside diameter of the body portion 46 of the tubular member 42 and the diameter of the bore 52 is substantially equal to the inside diameter of the body portion 40 of the tubular member 37. The outside diameter of the annular groove 51 is substantially equal to the outside diameter of the base portion 48 of the tubular member 42, whereas the inner diameter of the groove 51 is substantially equal to the inside diameter of the base portion 38 of the tubular member 37. The width of the groove 51 is sufficient to receive the flanges 39 and 45 on the tubular members 37 and 42, respectively. The base 50 is provided with a plurality of equally spaced tapped holes 53—53 and a pair of tapped holes 54—54 (Figs. 6, 8 and 9) provided in the walls thereof and extending from the bottom of the groove 51 to the opposite end of the base 50. A retainer ring 55 (Figs. 7, 8 and 9) is designed to fit into the groove 51 of the base 50, and has a plurality of holes 56—56 therethrough capable of being aligned with the holes 53—53 in the base 50.

The tubular members 37 and 42, the base 50, and the retainer ring 55 are assembled in the following manner to form the composite tuning plunger 15.

The base portion 38 of the tubular member 37 is positioned in the groove 51 of the base 50 having its external flange 39 resting on the bottom of said groove. The base portion 48 of the tubular member 42 is positioned in the groove 51 of the base 50, having its internal flange 45 resting on the bottom of the groove 51 and extending toward the external flange 39 of the tubular member 37. The retainer ring 55 then is passed between the concentrically positioned tubular members 37 and 42 until it rests in the groove 51 and against the flanges 39 and 45 of the said tubular members. The retainer ring 55 and the tubular members 37 and 42 are rigidly secured to the base 50 by means of a plurality of screws 57—57 threaded into the tapped apertures 53—53. After the tubular members 37 and 42 have been so secured to the base 50, a small quantity of solder is flowed around the ring 57 and the flanges 39 and 45 of the tubular members 37 and 42, respectively, to prevent corrosion of the clamped joint made in the groove 51 and to provide good electrical contact between the tubular members 37 and 42 and the base 50.

The entire assembly is then gold plated to prevent oxidation and corrosion of the metallic surfaces of the plunger, and thereby render the plunger highly conductive over a considerable period of time.

The gold plated plunger is then placed in a lapping fixture, whereupon the arcuate contacting tips 35—35 and 44—44 are lapped in hardened steel arbors having the same diameter as the conductors of the resonant cavity with a suitable lapping compound. This lapping operation removes the high spots from the annular series of contacting tips 41 and 49, and at the same time serves to remove the gold plating therefrom. Two highly advantageous features result from the lapping operation; namely, the contacting area of the arcuate tips 35—35 and 44—44 is substantially increased, insuring good electrical contact with the cavity wall, and a gold to beryllium-copper mechanical contact is obtained between the plunger and cavity whose frictional characteristics are superior to a gold to gold contact and far superior to a silver to silver contact.

The above-described method of fabricating a composite tuning plunger has proved to be a simple and economical method of construction because it comprises parts which are easy to manufacture and readily assembled into a composite unit. The specific advantages of a fabricated type of tuning plunger such as is described above are readily apparent. It will be noted that neither the base 50 nor the body portions 40 and 46 of the tubular members 37 and 42, respectively, contact the conductors 11 and 12 of the resonant cavity, whereas the annular series of arcuate contacting tips 41 and 49 forcibly engage the conductors 11 and 12, which cause the resilient fingers to be deflected from their normal position and exert considerable contact pressure thereagainst. The contact pressure exerted against the resonator conductors 11 and 12 assures that a uniform and low resistance electrical contact is made between the tuning plunger 15 and the conductors 11 and 12 of the resonator. The tuning plunger 15 must make good electrical contact with the resonant cavity in order that it may effectively seal the electromagnetic wave energy in the cavity, and provide critical tuning of an associated high frequency circuit.

Although the invention, as herein illustrated and described, is particularly well adapted for use in connection with a parallel type resonant cavity, it is readily applicable to various other types and configurations of resonators, wave guides, or the like, and, therefore, should be limited only by the scope of the appended claims.

What is claimed is:

1. In a variable resonant cavity having a central conductor coaxially positioned within a tubular conductor, the improved composite tuning plunger which comprises a tubular base having an annular groove cut in one end and a longitudinal bore extending therethrough, an outer tubular member formed from a thin comb-like resilient metallic strip to produce an annular series of elongated, closely spaced resilient fingers, each of said fingers having an arcuate contact tip formed on the end thereof, said annular series of resilient fingers of the outer tubular member having an outside diameter substantially equal to the outside diameter of the base and the annular series of contact tips thereof having a diameter substantially greater than the outside diameter of the base, an inner tubular member formed from a thin comb-like resilient metallic strip to produce an annular series of elongated closely spaced resilient fingers, each of said fingers having an arcuate contact tip formed on the end thereof, said annular series of resilient fingers of the inner tubular member having an inside diameter substantially equal to the bore of the base and the annular series of contacting tips thereof having an inside diameter substantially less than the bore, and a retainer ring for securing the outer and inner tubular member concentrically secured in the groove in said base, whereby a composite tuning plunger is formed having an outer and inner annular series of resilient fingers which are deflected by the conductors of the coaxial cavity so that the contact tips thereof engage the walls of the cavity conductors with substantial pressure.

2. In a variable resonant cavity having a central conductor coaxially positioned within a tubular conductor, the improved composite tuning plunger which comprises a cylindrical base having a longitudinal bore therethrough and an annular groove provided in one face thereof, an outer cylindrical member formed from a comb-like resilient metallic strip to have an annular series of closely spaced elongated resilient fingers having the free ends thereof crimped to form an annular series of arcuate contacting tips at one end of the cylindrical member and a slotted internal flange at the other end thereof, said annular series of resilient fingers of the outer member having an outside diameter substantially equal to the diameter of the base and said annular series of contacting tips having a diameter substantially greater than the diameter of said base, an inner cylindrical member formed from a comb-like resilient metallic strip to produce an annular series of closely spaced elongated resilient fingers having the free ends thereof clamped to form an annular series of arcuate contacting tips at one end of the inner cylindrical member and a slotted external flange at the opposite end of the cylindrical member, said annular series of resilient fingers of the inner member having an outside diameter substantially equal to the bore in the base and said annular series of contacting tips thereof having a diameter substantially less than the bore in said base, said inner and outer members being offset adjacent to the flanged ends so that their respective flanges fit in the groove of said base, and a ring for engaging the flanges so as to secure the outer and inner cylindrical members concentrically in the groove of the base, whereby a composite tuning plunger is formed having an outer and inner annular series of resilient fingers which are deflected by the conductors of the coaxial cavity so that the contact tips thereof engage the walls of the cavity conductors with substantial pressure.

JOHN H. SCHMIDT.

REFERENCES CITED

The following references are of record in the file of this patent:

UNITED STATES PATENTS

| Number | Name | Date |
|---|---|---|
| 2,086,905 | Evans | July 13, 1937 |
| 2,125,900 | Evans | Aug. 9, 1938 |
| 2,278,744 | Sparrow | Apr. 7, 1942 |
| 2,358,462 | Mahren | Sept. 19, 1944 |
| 2,379,047 | Thomas | June 26, 1945 |
| 2,407,147 | Fedotoff | Sept. 3, 1946 |
| 2,416,565 | Beggs | Feb. 25, 1947 |
| 2,422,160 | Woodward | June 10, 1947 |
| 2,434,508 | Okress | Jan. 13, 1948 |
| 2,438,912 | Hansen | Apr. 6, 1948 |